US008569113B2

(12) United States Patent
Reinecks et al.

(10) Patent No.: US 8,569,113 B2
(45) Date of Patent: Oct. 29, 2013

(54) METHOD FOR PRODUCING A MICROFLUID COMPONENT, AS WELL AS MICROFLUID COMPONENT

(75) Inventors: Holger Reinecks, Emmendingen (DE); Johanna May, Ludwigsburg (DE)

(73) Assignee: Robert Bosch GmbH, Stuttgart (DE)

( * ) Notice: Subject to any disclaimer, the term of this patent is extended or adjusted under 35 U.S.C. 154(b) by 90 days.

(21) Appl. No.: 13/119,783

(22) PCT Filed: Sep. 7, 2009

(86) PCT No.: PCT/EP2009/061522

§ 371 (c)(1),
(2), (4) Date: Jun. 2, 2011

(87) PCT Pub. No.: WO2010/031706

PCT Pub. Date: Mar. 25, 2010

(65) Prior Publication Data

US 2011/0241226 A1 Oct. 6, 2011

(30) Foreign Application Priority Data

Sep. 18, 2008 (DE) ........................ 10 2008 042 196

(51) Int. Cl.
*H01L 23/18* (2006.01)

(52) U.S. Cl.
USPC 438/125; 257/E23.18; 257/288; 257/E23.095; 438/106; 73/864.91

(58) Field of Classification Search
USPC .................. 257/E23.095, E23.18; 73/864.91; 438/125
See application file for complete search history.

(56) References Cited

U.S. PATENT DOCUMENTS

| | | | | |
|---|---|---|---|---|
| 2002/0047003 | A1 | 4/2002 | Bedingham et al. | |
| 2004/0087043 | A1 * | 5/2004 | Lee et al. | 438/6 |
| 2004/0137634 | A1 | 7/2004 | Robole et al. | |
| 2006/0076670 | A1 * | 4/2006 | Lim et al. | 257/699 |
| 2007/0243662 | A1 * | 10/2007 | Johnson et al. | 438/106 |

FOREIGN PATENT DOCUMENTS

| | | |
|---|---|---|
| DE | 601 05 979 | 10/2005 |
| DE | 10 2007 046 305 | 4/2009 |
| EP | 1 518 604 | 3/2005 |
| WO | WO 2005/005045 | 1/2005 |

OTHER PUBLICATIONS

International Search Report for PCT/EP2009/061522, dated Nov. 4, 2009.

* cited by examiner

*Primary Examiner* — Allen Parker
(74) *Attorney, Agent, or Firm* — Kenyon & Kenyon LLP

(57) ABSTRACT

A method for producing a microfluid component includes: Producing a single polymer layer made of at least one plastic or a plastic composite and having a microfluid structure, fitting the polymer layer with at least one semiconductor element, and/or with at least one electronic component, and/or with an optical or optoelectronic component, sealing the microfluid structure.

18 Claims, 2 Drawing Sheets

METHOD FOR PRODUCING A MICROFLUID COMPONENT, AS WELL AS MICROFLUID COMPONENT

FIELD OF THE INVENTION

The present invention relates to a method for producing a microfluid component and to a microfluid component.

BACKGROUND INFORMATION

From DE 601 05 979, a microfluid component is known, which is made up of a plurality of polymer layers. Each polymer layers has a fluidic microstructure which forms a micro channel or a reservoir for a fluid. In the known microfluid component, the microstructure is introduced into the polymer layer using a method that has an ablating effect.

In addition to the microfluid component known from DE 601 05 979, additional microfluid components are known, which are developed as micro-pump or pressure sensor, for instance, and include a plurality of microstructured polymer layers for absorbing, storing or conveying a fluid.

A microfluid component that is optimized with regard to its producibility is described in DE 10 2007 046 305. The microfluid component includes a plurality of microstructured polymer layers on which at least one semiconductor element is disposed.

All previously mentioned arrangements share the disadvantage that each polymer layer must be microstructured and coated separately, so that each individual polymer layer generates approximately the same cost in the production.

SUMMARY

Example embodiments of the present invention provide a microfluid component that is able to be produced by a less complex production process, and to a method for the simplified production of a microfluid component.

In order to avoid repetitions, features disclosed in terms of the method shall count as disclosed as well in terms of the device. Likewise, features disclosed in terms of the device shall count as disclosed in terms of the method.

Example embodiments of the present invention are based on combining all microfluid structures on a single, in particular middle polymer layer, instead of providing a plurality of polymer layers that are positioned on top of each other and provided with an individual microfluid structure in each case. A polymer layer is understood to denote a layer which is at least partially made of plastic and which may also be made from a composite material, such as a plastic/metal combination, for instance. In a method according to example embodiments of the present invention, the single polymer layer provided with a microfluid structure is fitted with at least one semiconductor element and/or at least one electronic component, such as a sensor, an actuator, a microcontroller, a resistor, etc. By providing at least one semiconductor element and/or one electronic component, the functionality of the obtained microfluid component is expanded. Preferably, the semiconductor component and/or the electronic component are/is an element that interacts with the microfluid structure, e.g., a control chip for a micro pump formed in the single microfluidally structured polymer layer, an evaluation unit for a microfluid sensor, or a semiconductor sensor. Because of the integration of at least one semiconductor element in the single polymer layer provided with a microfluid structure, "intelligent" microfluid components are able to be produced in a simple manner; these components not only perform purely microfluid functions such as storing, absorbing and/or pumping fluids, preferably of liquid substances, but additionally also perform the functionality of a semiconductor component and/or an electronic component, which preferably interacts with the microfluid structure. The single polymer layer having a microfluid structure preferably is the single polymer layer of the microfluid component overall. Providing only one polymer layer having a microstructure makes it possible to dispense with the production of additional, microfluidally structured polymer layers, which entails high production expense. A microfluid structure denotes a surface structure and/or at least one structure that infiltrates the polymer layer and/or at least one structure that is enclosed in the polymer layer, which is used for absorbing, storing and/or conveying of fluids. For example, the microfluid structure is a fluid channel and/or a fluid reservoir, and/or a fluid cavity etc. The semiconductor element and/or the electronic component may be disposed either directly on top of the polymer layer or on a functional layer possibly provided on the polymer layer, which will be described further down.

In order to obtain a microfluid structure encapsulated from the environment, with the exception of the feed line and discharge line for a fluid connection of the microfluid structure, which will be discussed further down, the microfluid structure is sealed, in particular on two sides, in a method for producing a microfluid component described herein.

Over all, a method according to example embodiments of the present invention provides a simple option for producing an "intelligent" microfluid component, in which only a single polymer layer provided with a microfluid structure needs to be made available.

As already mentioned in the introduction, it is preferred if, preferably prior to the fitting with the at least one semiconductor element and/or the at least one electronic component, the polymer layer is partially or completely coated with at least one functional layer, preferably with a plurality of functional layers. In order to assemble the polymer layer, the semiconductor element and/or the electronic component may be secured in position either directly on the polymer layer or, preferably, on the functional layer.

In particular when the at least one semiconductor component and/or the at least one electronic component are/is secured in position in a wire-bonding process, it may be advantageous to provide at least one, preferably exclusively one, protective layer in order to protect the at least one semiconductor component and/or the at least one electronic component, in particular to protect the wire bonds. For example, it is possible to protect the wire bonds by a gel treatment.

An example embodiment in which the microstructure is sealed by two-sided sealing of the fitted and possibly coated microfluid structure is especially preferred. This prevents an undesired fluid leakage on two sides of the component, in particular sides that lie parallel to each other. The sealing, as will be explained later in the text, may be realized by correspondingly thin, preferably laminatable foils, for instance.

Especially preferred is an example embodiment in which the polymer layer is provided with a metallization, especially in order to form at least one circuit trace or at least one electrode, in particular prior to fitting it with at least one semiconductor element and/or an electronic component, the circuit trace or the electrode preferably being used for the electrical contacting of the semiconductor element and/or the electronic component. In addition or as an alternative, a protective layer may be provided at the desired locations on the polymer layer, e.g., one made of silicon nitride, and/or a biologically active layer may be provided.

To produce the microfluid structure in the polymer layer, it is preferably formed by hot-stamping and/or with the aid of injection molding, while dispensing with an etching process.

It is especially preferred if the at least one semiconductor element and/or the at least one electronic component are/is secured in position using the so-called flip chip method which features low height. In addition or as an alternative, elements may be secured in place either directly or only indirectly on the polymer layer using the wire-bonding method or the adhesive bonding method.

As mentioned earlier already, it is especially preferred to seal the microfluid structure by a foil, especially a heat-sealing foil and/or laminating foil. In this context it is especially preferred if the foil is applied on the possibly coated, assembled polymer layer on two sides, which preferably are parallel and face away from each other. The sealing foil should be selected such that it exhibits the appropriate required characteristics with regard to media resistance, temperature resistance and surface activation. In order to connect the microfluid structure to the outside, it is especially preferred to use sealing foils that are easily piercable by needles so as to create a fluidic connection. During the sealing, it should be ensured that recesses are provided for corresponding electrical connections for the at least one semiconductor element and/or the electronic component. For example, the foils may be provided with an adhesive agent, which preferably is applied by screen printing, and then secured in position. It is also possible to secure the laminatable foils in place by laser welding.

In an especially preferred manner, the described method is suitable for the simultaneous production of a plurality of preferably identical microfluid components in a so-called reel-to-reel process; in this case, a plurality of polymer layer sections, which are preferably formed as one piece and provided with a microfluid structure in each case, are placed next to each other and assembled, possibly coated and sealed, as previously described.

Preferably, at least one fluidic connection of the microstructure to the outside should be realized at the end of the production process. Toward this end, for example, a sealing foil may first be pierced by at least one needle. As an alternative, pre-stamped holes in the foil may be connected. The holes, especially stamped or pierced holes, to be provided in the foil may be situated both on an upper and a lower side or on the upper and lower sides. In addition or as an alternative, the utilization of lateral connections provided in the polymer layer is possible for a fluidic connection.

Example embodiments of the present invention also provide a microfluid component, which preferably is produced as previously described. The microfluid component includes a single polymer layer provided with a microfluid structure, which is additionally fitted with at least one semiconductor element and/or at least one electronic component. To ensure the operativeness of the microfluid structure, it is sealed toward the outside. In an especially preferred manner, the at least one semiconductor element and/or the at least one electronic component are/is situated inside this seal; electric connections or contacts are preferably spared from the sealing in order to electrically contact the semiconductor element and/or the electronic component from the outside. A fitted polymer layer provided with a microfluid structure also denotes a polymer layer in which the at least one semiconductor element and/or the at least one electronic component do/does not contact the polymer layer directly but rather only indirectly, via a functional layer, especially a metallic coating.

Additional options of the microfluid component result at least implicitly from the previous description of the production method, so that, in order to avoid repetitions, reference is made to the comments regarding the method for the further refinement of the microfluid component.

Additional advantages, features and details of example embodiments of the present invention derive from the following description of exemplary embodiments as well as from the figures.

DETAILED DESCRIPTION

Figure 1:
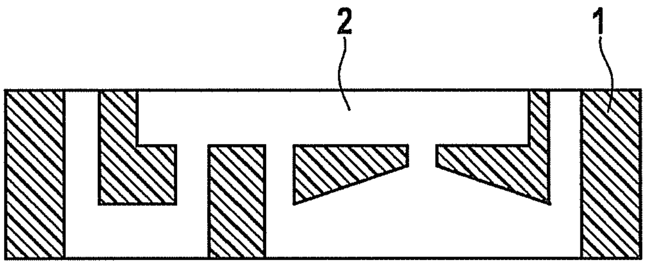
FIG. 1 illustrates a polymer layer provided with a microfluid structure.

Identical elements and elements that have the same function have been provided with matching reference numerals in the figures.

FIG. 1 shows a single polymer layer 1 made of a suitable plastic or plastic composite, such as a previously metalized plastic or a plastic layer system. Polymer layer 1 is provided with a schematically illustrated microfluid structure 2, which is able to be introduced when producing polymer layer 1 in a hot embossing process or an injection molding process.

Figure 2:
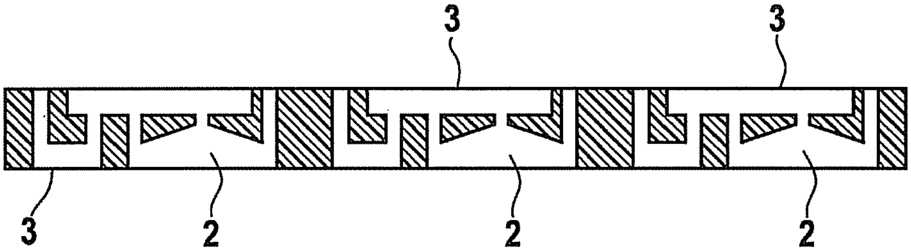
FIG. 2 illustrates a plurality of polymer layers formed as one piece, situated next to each other and provided with a microfluid structure in each case.

FIG. 2 shows a polymer layer, which is made up of a plurality of adjacently disposed polymer layer sections 3 provided with an individual microfluid structure 2, polymer layer sections 3 being formed on a silicon wafer in one piece. A polymer layer shown in FIG. 2 and made up of a plurality of polymer layer sections 3 that are disposed next to each other is suitable for producing a multitude of identical microfluid components in a so-called reel-to-reel process.

In the following text, it is not the reel-to-reel process that is described but the production of a single microfluid component, the reel-to-reel process being characterized by a simultaneous application of the described method on the multitude of polymer layer sections 3 according to FIG. 2.

Figure 3:
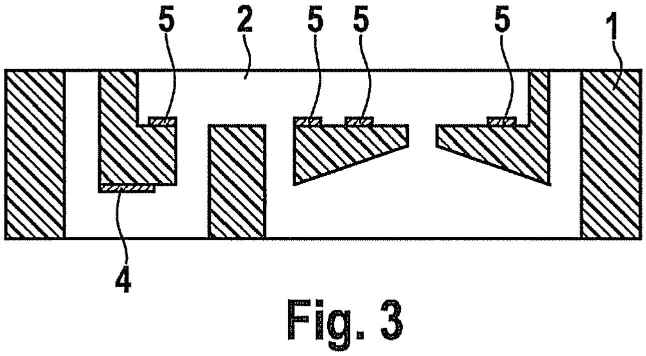
FIG. 3 illustrates the polymer layer shown in FIG. 1, provided with functional layers.

FIG. 3 shows polymer layer 1 having a microfluid structure 2 following the completion of a further method step. It can be gathered that polymer layer 1, more precisely, microfluid structure 2, is coated with different functional layers 4, 5, the functional layer designated by reference numeral 4, for example, being a bioactive layer, and the functional layers designated by reference numeral 5 being metal coatings.

Figure 4:
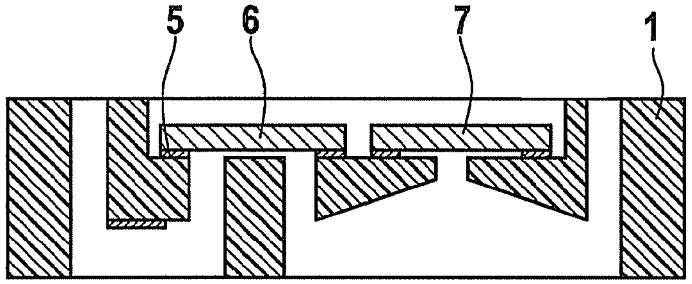
FIG. 4 illustrates the polymer layer shown in FIG. 3 following the fitting with semiconductor elements and/or electronic components.

FIG. 4 shows polymer layer 1 following a further production step. It can be seen that a semiconductor element 6 realized as microchip, as well as an electronic component 7 are fixed in place on functional layers 5 (metal coatings), using the flip chip method in this case. Semiconductor element 6 and electronic component 7 may possibly be protected by a protective layer, e.g., a gel layer (not shown).

Figure 5:
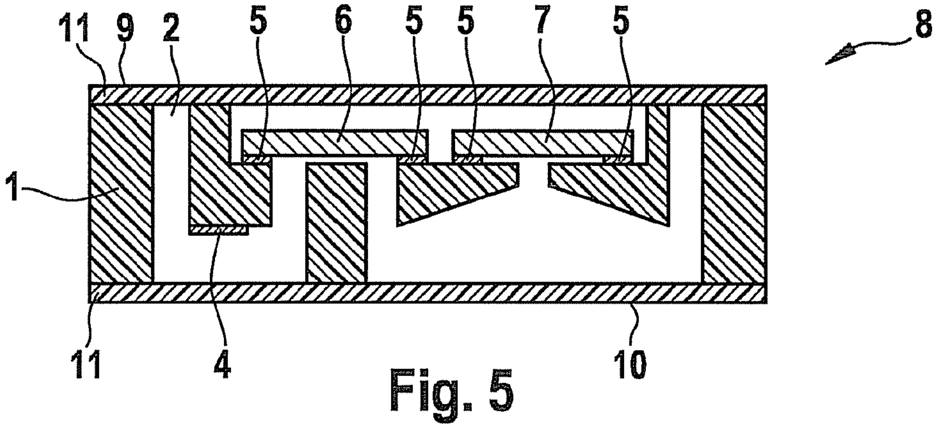
FIG. 5 illustrates the polymer layer shown in FIG. 4, following a sealing process.

FIG. 5 illustrates microfluid component 8, which is complete except for the fluidic connections. It includes the single polymer layer 1 featuring a microfluid structure 2, which polymer layer has been provided with previously explained functional layers 4, 5, as well as a semiconductor element 6 and an additional electronic component 7. It can be seen that a sealable foil 11 seals the microfluid structure toward the outside on two sides 9, 10, facing away from each other, i.e., at the bottom in the drawing plane, and on top in the drawing plane.

Figure 6:
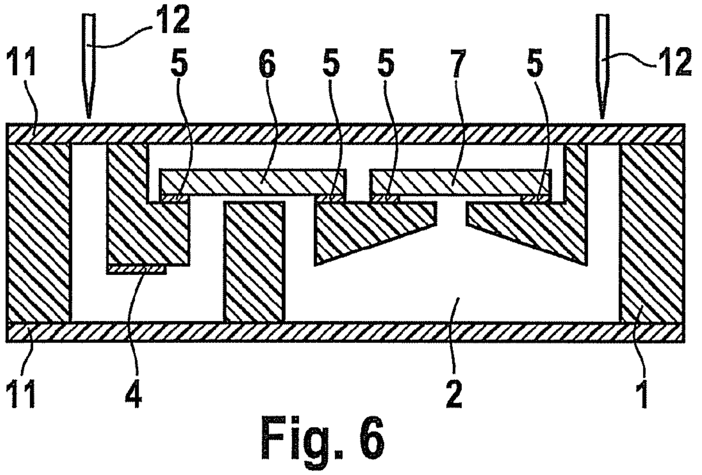
FIG. 6 illustrates the nearly completed microfluid component prior to the fluidic contacting.

FIG. 6 shows the last method step for completing microfluid component 8. As can be seen, fluidic connection holes are introduced into the upper surface of foil 11 used as seal, with the aid of schematically indicated hollow needles 12. In addition or as an alternative, fluidic connection holes may also be provided in the lower foil in the drawing plane. In the event that no inductive coupling of electrical energy or uncoupling of signals is possible, then recesses (not shown) for electrical connections for the semiconductor element and electronic component 7 may be provided in foil 11. As an alternative to piercing connecting holes with the aid of hollow needles 12, holes that have been introduced in at least one foil and/or on the sides in polymer layer 1 with the aid of hollow needles 12 may be fluidically connected.

What is claimed is:

1. A method for producing a microfluid component, comprising:

producing a layer of polymer, the polymer (I) being formed of at least one of (a) a plastic and (b) a plastic composite, and (II) forming polymer components arranged to provide within the layer of polymer a microfluid structure;

fitting at least one of (a) a semiconductor element, (b) an electronic component, (c) an optical component, and (d) an optoelectronic component onto at least one of the polymer components; and sealing the microfluid structure by providing a sealing layer on each of two sides of the layer of polymer, the sealing layers facing away from each other.

2. The method according to claim 1, wherein the layer of polymer is at least one of (a) partially and (b) completely coated with at least one functional layer prior to the fitting.

3. The method according to claim 2, wherein the functional layer is at least one of (I) arranged as at least one of (a) a metal coating, (b) a circuit trace, (c) an electrode, and an antenna for inductive coupling of at least one of (i) energy and (ii) signals, (II) arranged as a protective layer, (III) arranged as a protective later made from silicon nitride, and (IV) arranged as a biologically active layer.

4. The method according to claim 2, wherein the sealing is performed after the fitting and when the layer of polymer is in its coated state.

5. The method according to claim 1, wherein prior to sealing the microfluid structure, at least one of (a) a protective layer and (b) a gel layer is applied on at least one of (a) the semiconductor element, (b) the electronic component, (c) the optical component, and (d) the optoelectronic component.

6. The method according to claim 1, wherein the layer of polymer is microstructured by at least one of (a) hot stamping, (b) thermoforming, and (c) injection molding.

7. The method according to claim 1, wherein the fitting with at least one of (a) the semiconductor element and (b) the electronic component is performed using at least one of (a) a flip chip method, (b) a wire bonding method, and (c) an adhesive bonding method.

8. The method according to claim 1, wherein the sealing of the microfluid structure is performed using at least one of (a) sealable foil, (b) a heat-sealing foil, and (c) laminating foil.

9. The method according to claim 1, wherein the polymer layer includes a plurality of polymer layer sections that each includes a respective microfluid structure, the sections being at least one of (a) identical, (b) disposed next to each other, (c) produced jointly, and (d) produced in a reel-to-reel process, to form a microfluid component.

10. The method according to claim 1, wherein the microfluid structure is fluidically connected to an exterior of the microfluid component.

11. The method according to claim 10, wherein the connection of the microfluid structure to the exterior of the microfluid component is made using hollow needles.

12. The method according to claim 10, wherein the connection of the microfluid structure to the exterior of the microfluid component is made after the sealing.

13. The method according to claim 1, wherein the microfluid component produced by the method includes the layer of polymer, (I) including the microfluid structure in a sealed state in which the microfluid structure is sealed by the sealing layers, and (II) with the at least one of (a) the semiconductor element, (b) the electronic component, (c) the optical component, and (d) the optoelectronic component being fitted onto the at least one of the polymer components.

14. A microfluid component, comprising:

a layer of polymer, wherein the layer includes a cavity and the polymer is formed as polymer structures within the cavity, wherein the polymer structures form a single microfluid channel that meanders through the polymer structures, and wherein the polymer structures are formed of at least one of (a) a plastic and (b) a plastic composite; and at least one of (a) a semiconductor element, (b) an electronic component, (c) an optical component, and (d) an optoelectronic component fitted on one or more of the polymer structures;

wherein the microfluid channel is sealed by a respective sealing layer provided on each of two sides of the layer of polymer, the sealing layers facing away from each other.

15. A method for producing a microfluid component, comprising:

producing a layer of polymer, the polymer (I) being formed of at least one of (a) a plastic and (b) a plastic composite, and (II) forming polymer structures that are arranged to form a microfluid channel;

fitting onto at least some of the polymer structures at least one of (a) a semiconductor element, (b) an electronic component, (c) an optical component, and (d) an optoelectronic component; and sealing the microfluid channel by providing a respective sealing layer on each of two sides of the layer of polymer, the sealing layers facing away from each other.

16. A method for producing a microfluid component, comprising:

producing a layer of polymer, the polymer being formed of at least one of (a) a plastic and (b) a plastic composite;

without use of etching, structuring the polymer into a plurality of polymer components arranged to provide a microfluid structure within the layer of polymer;

fitting at least one of the polymer components with at least one of (a) a semiconductor element, (b) an electronic component, (c) an optical component, and (d) an optoelectronic component; and sealing the microfluid structure by providing a respective sealing layer on each of two sides of the layer of polymer, the sealing layers facing away from each other.

17. The method according to claim 16, wherein the plurality of polymer components are formed by one of hot-stamping and injection molding.

18. A microfluid component, comprising:

a layer of polymer, the polymer (I) being formed of at least one of (a) a plastic and (b) a plastic composite, and (II) forming a plurality of polymer components arranged to provide in the layer of polymer a microfluid structure; and at least one of (a) a semiconductor element, (b) an electronic component, (c) an optical component, and (d) an optoelectronic component fitted onto at least one of the polymer components;

wherein the microfluid structure is sealed by a sealing layer on each of two sides of the layer of polymer, the sealing layers facing away from each other.

* * * * *

UNITED STATES PATENT AND TRADEMARK OFFICE

CERTIFICATE OF CORRECTION

PATENT NO. : 8,569,113 B2
APPLICATION NO. : 13/119783
DATED : October 29, 2013
INVENTOR(S) : Reinecks et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 166 days.

Signed and Sealed this
Fifteenth Day of September, 2015

Michelle K. Lee
*Director of the United States Patent and Trademark Office*